METHOD OF MANUFACTURING SEMICONDUCTOR DEVICES

Filed June 23, 1970

3 Sheets-Sheet 1

METHOD OF MANUFACTURING SEMICONDUCTOR DEVICES

Filed June 23, 1970

3,761,328

METHOD OF MANUFACTURING SEMICONDUCTOR DEVICES

Toshio Abe, Kanro Sato, Masami Konaka, and Takamichi Narita, Yokohama, Japan, assignors to Tokyo Shibaura Electric Co., Ltd., Kawasaki-shi, Japan Filed June 23, 1970, Ser. No. 49,007
Claims priority, application Japan, June 24, 1969, 44/49,370
Int. Cl. H01l *7/00, 7/36, 7/44*
U.S. Cl. 148—188 13 Claims

ABSTRACT OF THE DISCLOSURE

An insulating film mainly composed of silicon dioxide and having at least one opening is formed on the surface of a semiconductor wafer and then a readily etchable film is applied on the exposed surface of the opening, which is mainly composed of silicon dioxide and contains an impurity element adapted to form a shallow impurity level and an additive substance which increases the etching speed of the readily etchable film after diffused with the impurity to a value higher than that of the insulating film and which does not impair the electrical characteristics of the diffused area.

This invention relates to a method of manufacturing semiconductor devices, more particularly bipolar transistors and junction type field effect transistors suitable for use in microwave regions.

As is well known in the art bipolar transistors suitable for amplifying small signals in the microwave regions are required to satisfy the following requirements.

(1) That the base width $W_B$ should be very narrow, (2) That the emitter electrode should be small, (3) That the base resistance should be low.

To this end the number of effective carriers in the base layer immediately beneath the emitter region must be large, (4) The base-collector capacitance should be small, (5) The collector series resistance should be small, and (6) The contact resistance between electrode lead wires and base electrode and emitter electrode should be low.

Most of the prior silicon planer transistors for microwave use have been fabricated by the same process as the ordinary silicon planer transistors. For example, in the case of an NPN-type transistor boron is diffused into an N-type silicon substrate to form a base region and then phosphorus is diffused to form an emitter region.

A transistor utilized to amplify signals of a frequency ranging from 2 gHz. to 6 gHz., for example, is required to have a base region of extremely narrow width ($W_B$) of 0.1 micron.

However, with a conventional method it is very difficult to obtain such an extremely narrow base width due to the well known emitter dip effect, or the phenomenon that while the emitter is formed by diffusion, the dopant for forming the base diffuses into the collector region immediately beneath the emitter region. Even if it were possible to obtain very narrow base width by using a special diffusion condition it would be necessary to make extremely shallow the depth ($Xje$) of the emitter junction in order to increase the number of effective carriers ($Nc$) in the base layer immediately below the emitter region. Thus, for example, where the surface concentration of the phosphorus diffused emitter layer equals $5\times10^{20}/\text{cm.}^3$, the surface concentration of the boron diffused base layer equal $1\times10^{19}/\text{cm.}^3$, then under conditions of $W_B=0.1\mu$ and $Xje=0.08\mu$, the resistance of the base layer immediately beneath the emitter layer will be equal to 20 kilohms. It is considered that this value corresponds to the number of carriers $Nc \doteqdot 25\times10^{12}/\text{cm.}^2$ which is near the permissible lower limit.

With an emitter having a junction depth $Xje=0.08\mu$, it is very difficult to connect an electrode metal to the emitter region. More particularly, some metals have a tendency to short circuit emitter and base regions thus making it difficult to fabricate transistors of satisfactory quality. If the emitter junction depth were made larger than the above described value to avoid the danger of short circuiting the number of carriers would be deficient thus occurring a punch through phenomenon between emitter and collector electrodes.

Owing to contradictory requirements described above, it has been extremely difficult to manufacture transistors for microwave use by the ordinary diffusion technique.

To solve this problem we have already proposed a transistor utilizing an arsenic diffused layer as the emitter region.

Use of the arsenic diffused layer results in a number of advantages including elimination of the dip effect, easy obtaining of a narrow base width and a larger number of $Nc$ than a conventional transistor having a phosphorus doped emitter and a boron doped base and having the same $Xje$ and $W_B$ because the impurity distribution of the arsenic doped layer has a steeper stepwise configuration than the complementary error function distribution curve. For example, where $Xje=1000$ A., $W_B=1000$ A., the surface concentration of the emitter diffused layer $Nse=1\times10^{20}/\text{cm.}^3$ and the surface concentration of the base diffused layer $Nsb=2\times10^{19}/\text{cm.}^3$, the resistance of the base layer immediately beneath the emitter will be 14 kilohms/cm.$^2$ which corresponds to $N\doteqdot4\times10^{12}/\text{cm.}^2$.

The so-called "washed emitter method" has been proposed as a prior art method of reducing limitations imposed by the accuracy with which the mask should be aligned in using an opening for emitter diffusion as that for electrode deposition as well as by requirements for precision work.

This method utilizes the fact that is an NPN-type transistor having a phosphorus diffused emitter, the insulating film formed on the surface of the emitter layer after the phosphorus diffusing step into the emitter, is in the form of silicon dioxide containing a large quantity of phosphorus, that is phosphorus silicide glass having much faster etching rate than a high purity silicon dioxide film commonly used as the mask.

However, when one tries to fabricate a transistor for use in microwave circuit and having an arsenic diffused emitter by the washed emitter method he will encounter difficult problems as described hereinbelow.

On the entire surface of a wafer comprising a silicon dioxide film perforated with an opening for diffusion of an emitter is deposited a film of arsenic doped silicon dioxide to diffuse the emitter. The film of arsenic doped silicon dixoide film is etched to form an opening for leading out an emitter electrode. Since the film of arsenic doped silicon dioxide film and that of high purity dioxide film are etched substantially at the same rate, the silicon dioxide film constituting that part of the mask which is disposed around the emitter is also etched to a sufficient extent to allow the emitter-base junction to be exposed. Thus when there is fitted an electrode metal, the emitter-base region will be short-circuited thereby.

Further, when diffusing arsenic into the silicon substrate from a vapour phase if the diffusion is carried out in a non-oxidizing atmosphere in order to avoid formation of an oxide film on the surface of the silicon substrate the exposed surface of the silicon substrate will be corroded by the moisture or oxygen contained in small quantity in the non-oxidizing atomsphere, and since it is difficult to control the quantity of the moisture or oxygen it is not possible to form extremely shallow junctions with high reproducibility.

Although a PNP-type transistor is suitable to use as a high frequency low noise transistor because of its low base resistance, since the silicon dioxide film containing a large quantity of boron (boron silicide glass) which is formed at the time of diffusing boron to prepare the emitter has an etching rate not materially different from that of the high purity silicon dioxide film but is rather difficult to etch, such boron containing silicon dioxide film can not be removed by the washed emitter method.

The above-described method of utilizing phosphorus for the emitter is not suitable to fabricate transistors for microwave use in view of the problem of the emitter dip and the like.

Although the n channel junction type field effect transistor is suitable for microwave use from the standpoint of carrier mobility, in order to improve the characteristics of the transistor, it is also necessary to satisfy the following requirements.

(7) That the gate width (W) should be narrow, (8) That the junction capacity of the $P^+$ diffusion gate side should be small, and (9) That the layer resistance of the gate should be low.

Where the photo-etching technique is used the minimum width W' of the mask opening for forming the gate is at most about one micron so that when an impurity is diffused through this opening to form the $P^+$ region it is inevitable to diffuse the impurity in the lateral direction.

The condition 7 requires as far as possible shallow diffusion which also satisfies the condition 8. However, the shallow diffusion increases the layer resistance which contradicts the condition 9. It becomes, therefore, necessary to coat an electrode metal on the diffused gate layer to improve this condition.

Similar to the above described bipolar transistor, it is almost impossible to form an electrode opening by the photo-etching technique through the silicon dioxide film within a gate diffusion opening of the width of about one micron. Although it is easy to form an electrode by using the so-called washed gate method which corresponds to the washed emitter method utilized to fabricate the bipolar transistor, where boron is to be diffused it is impossible to use the washed gate method by the reason described above.

The object of this invention is to provide an improved method of manufacturing semiconductor devices which can eliminate difficulties of the prior method.

We have investigated new sources of impurities which can utilize an opening in a film provided on the surface of a semiconductor body to diffuse an acceptor or a donor impurity as the opening for forming an electrode after the diffusion of the impurity as in the washed emitter method or the washed gate method and found additive materials manifesting excellent properties.

Such additive materials are required not to have adverse effect upon the semiconductor body and to have considerably higher etching rate than the mask so that it can be readily removed from the mask after diffusion without affecting it. By the term "adverse effect" is meant inversion of the desired conductivity type of the semiconductor body or decrease in its impurity concentration, for example conversion of the N-type emitter region into the P-type by the addition of said additive material, shortening of the life time of the carrier, by the addition of iron, nickel or copper, for example, and lowering of the ability of the oxide as the passivation layer, for example, the lowering of the ability manifested by sodium and potassium.

We have discovered that readily etchable materials having faster etching rate than the ordinary mask film, high purity silicon dioxide for example, can be obtained by incorporating the following elements, singly or in combination, into silicon dioxde.

The additive materials should contain a substance capable of dissolving to some extent their oxides and should not substantially affect the semiconductor body when they are incorporated therein. Among the material which can satisfy these requirements may be mentioned beryllium, magnesium, calcium, titanium, vanadium, germanium, tin, antimony, tellurium, cesium, barium, cerium, tungsten, thallium, bismuth, zirconium, molybdenum, cadmium, lead, etc. These elements may be used singly or in combination. Among these elements, especially germanium can form solid solution with silicon at any proportion so that where silicon is used as the semiconductor body, a large quantity of germanium can be incorporated into a silicon dioxide film acting as the mask without the danger of precipitating germanium on the surface of the semiconductor body.

Following table shows the relationship between the etching rate of a silicon dioxide film containing germanium in an etching solution of a composition consisting of hydrofluoric acid:nitric acid:water=15:10:300 (hereinafter called the P-etchant) and the germanium content.

| Concentration (mol percent) of $GeO_2$ in silicon dioxide incorporation with germanium: | Etching rate by the P-etchant (A./sec.) |
|---|---|
| 0 | About 3 |
| 10 | About 30 |
| 20 | About 40 |
| 30 | About 50 |

As can be noted from this table the silicon dioxide film containing 10 mol percent of $GeO_2$ manifests an etching rate 10 times faster than that of the high purity silicon dioxide film when treated with the P-etchant, and such large difference in the etching rate enables use of the washed emitter method or the washed gate method.

As it is possible to control the etching rate over a wide range by varying the quantity of the additive material it is very easy to obtain impurity sources of the desired etching rate which is advantageous to the fabrication of semiconductor devices.

The etching rate of the silicon dioxide film incorporating the additive material varies dependent upon the type of the additive materials as well as the type of the etching solutions. However, irrespective of the type of the additives utilized it is essential to add more than 1 mol percent of the additive to obtain a film having an etching rate sufficiently higher than ordinary mask, for example a high purity silicon dioxide film.

With the additive of less than 1 mol percent, it is not possible to form a film having sufficiently higher etching rate than the conventional mask material for any etching solution.

After heating at an elevated temperature, a silicon dioxide film containing about 10 mol percent of PbO manifests an etching rate of 40 A./sec. in the P-etchant whereas after heating at an elevated temperature, a silicon dioxide film containing about 5 atom percent of vanadium manifests an etching rate of about 15 A./sec. in the P-etchant.

High frequency sputtering method, chemical vapour deposition method and the like may be used to form on a semiconductor body a silicon dioxide film containing an additive substance promoting the etching rate of the film and an acceptor or donor impurity providing a shallow impurity level in the semiconductor body. The term "shallow impurity level" means the energy level of the impurity situated at a depth less than 0.1 ev. from the conduction band or valance band. Of course, the level is different for different semiconductor bodies (Ge, Si and GaAs) and different impurities incorporated therein. The following table illustrates some examples of impurity levels.

TABLE

| Semiconductor | Impurities | Depth of impurity levels (ev.) |
|---|---|---|
| Ge | P, As, Sb, Li: donors | Less than 0.015. |
| Ge | B, Al, Ta, In, Ga: acceptors | Do. |
| Si | P, As, Sb, Li: donors | Less than 0.05. |
| Si | B, Al, Ga: acceptors | Less than 0.07. |
| GaAs | Te, Ge, Sn, Se: donors | Less than 0.01. |
| GaAs | Mg, Cd, C, Zn: acceptors | Less than 0.05. |

Where antimony or bismuth is utilized to diffuse the acceptor impurity into the semiconductor body it is essential to select the quantity of antimony or bismuth diffused in such a range that they will not substantially affect the surface concentration of the acceptor impurity or a range in which the surface concentration of the acceptor is sufficiently higher than that of antimony or bismuth.

The mask can of course be comprised of high purity silicon dioxide or so-called doped oxide consisting of silicon dioxide doped with desired acceptor impurities or donor impurities.

In addition to above escribed P-etchant a mirture prepared from at least one selected from the group consisting of nitric acid, hydrochloric acid, acetic acid and sulfuric acid, at least one selected from the group consisting of hydrogen fluoride, sodium fluoride and ammonium fluoride, and water, or an alkaline aqueous solution, for example, aqueous solution of caustic potash, caustic soda, etc. may be used as the etching solution.

As the semiconductor material, silicon germanium and gallium arsenide are suitable for use in this invention.

This invention can be more fully understood from the following detailed description when taken in connection with the accompanying drawings, in which.

EXAMPLE 1

Figure 1:
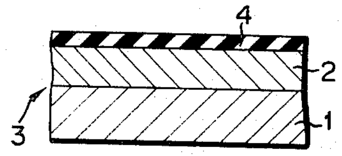
FIGS. 1 to 10 are sectional views of a semiconductor device illustrating various steps of the method of manufacturing the same in accordance with one embodiment of this invention.

As shown in FIG. 1, an N-type layer 2 having a resistivity of about 1 ohm-cm. and a thickness of about $3\mu$ was formed by the vapour phase epitaxial growth on the (111) major plane of an $N^+$-type silicon substrate 1 to obtain a silicon wafer 3 and the wafer was heated at 450° C. in a current of a mixture of $SiH_4$, $O_2$ and $N_2$ to deposit a silicon dioxide film 4, about 3000 A. thick, on the surface of the epitaxially grown layer 2.

Figure 11:
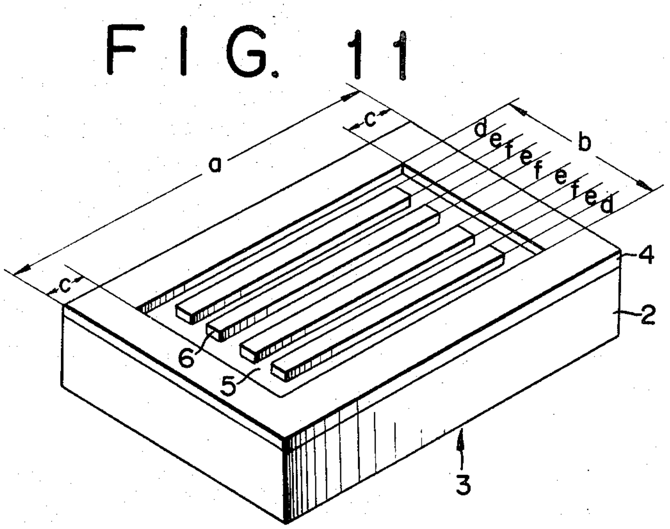
FIG. 11 is a perspective view of the semiconductor device to show the step of forming an opening in an insulating film.

The wafer 3 was then heated in a flow of nitrogen at a temperature of 1100° C. for 10 minutes to increase the density of silicon dioxide film 4 and, as shown in FIG. 11, an opening 5 for diffusing a $P^+$-type guard ring is formed in the silicon dioxide film 4 by the photo-etching technique. The dimensions of various portions of the opening 5 were $a=62\mu$, $b=49\mu$, $c=3\mu$, $d=7\mu$, $e=5\mu$ and $f=3\mu$.

Four strips 6 of silicon dioxide were left in the opening 5 like islands.

Figure 2:
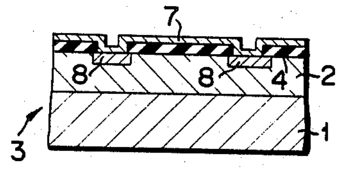

The wafer 3 was then heated at a temperature of 450° C. in a flow consisting of $SiH_4$, $B_2H_6$, $O_2$ and $N_2$ to form a boron containing silicon dioxide film 7 of 2000 A. thick on the surface of water 3. The wafer was then heated in nitrogen atmosphere at a temperature of 1100° C. for 30 minutes to diffuse boron from the epitaxially grown layer 2 through opening 5 to form a boron diffused $P^+$-type guard ring layer 8 having a surface concentration of more than $2\times10^{20}/cm.^3$, as shown in FIG. 2.

Figure 3:
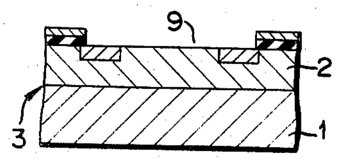
Figure 4:
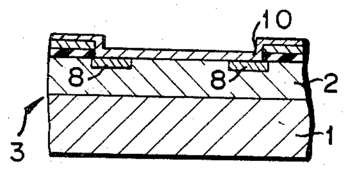

Silicon dioxide film 4 and boron containing silicon dioxide film 7 of the wafer 3 were removed by the photo-etching method at portions where a base layer is to be formed to form a base opening 9 as shown in FIG. 3 and thereafter the wafer was again heated to 450° C. in the flow consisting of $SiH_4$, $B_2H_6$, $O_2$ and $N_2$ to deposit a second boron containing silicon dioxide film 10 of 2000 A. thick on the surface of the wafer 3, as shown in FIG. 4.

Figure 5:
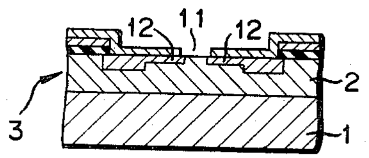

The second boron containing silicon dioxide film 10 of the wafer 3 was removed by the photo-etching technique at portions where an emitter is to be formed to form an emitter opening 11 as shown in FIG. 5. The emitter opening 11 had a width of $1.5\mu$ and a length of $50\mu$. Although, actually four openings 11 were formed, only one of them is shown to simplify the drawing. The wafer 3 was heated in a current of nitrogen at a temperature of 1000° C. for 12 minutes to form a boron diffused P-type layer 12 for base layer connection in the epitaxially grown layer 2 immediately below the second boron containing silicon dioxide film 10 in said base opening 9 excepting the emitter opening 11. The surface concentration of P-type layer 12 was approximately $5\times10^{18}/cm.^3$.

Figure 6:
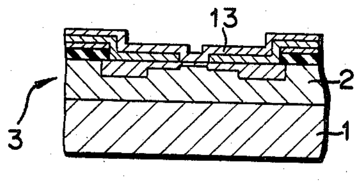

Then a readily etchable silicon dioxide film 13 containing germanium and boron (hereinafter termed as (Ge+B) doped oxide film) was coated on the wafer 3 by the high frequency sputtering mehod. (See FIG. 6.)

As the germanium source was used $GeO_2$ and as the boron source $B_2O_3$ was used.

4 sheets of $GeO_2$, each having an area of 6 cm.$^2$ and 10 sheets of $B_2O_3$, each having an area of 0.25 cm.$^2$, were respectively mounted on quartz plates of an area of 150 cm.$^2$.

High frequency sputtering was performed by evacuating a container to a vacuum of less than $5\times10^{-6}$ mm. Hg, admitting a 1:1 mixture of argon and oxygen into the container to a pressure of $1\times10^{-2}$ mm. Hg and applying an anode voltage of 1.8 kv. at a frequency of 13.56 mHz. Sputtering was continued for 45 to 60 minutes.

The wafer was then heated in a flow of nitrogen at a temperature of 1000° C. for 30 minutes to diffuse boron into the semiconductor body from the (Ge+B) doped oxide film in the emitter opening 11 to form a boron diffused layer 14 for the base, the surface concentration of boron thereof being about $2\times10^{19}/cm.^3$.

Figure 7:
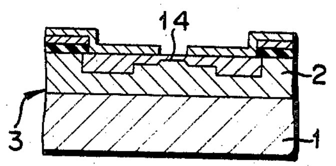

The wafer 3 was then dipped in the P-etchant for 120 seconds to completely dissolve off the (Ge+B) doped oxide film 13 as shown in FIG. 7. After the diffusion of boron, the etching rate of the (Ge+B) doped oxide film in the P-etchant was about 30 A./sec. which is sufficiently higher than the etching rate of 3 A./sec. of the conventional silicon dioxide film formed at an elevated temperature which means easy removal of the (Ge+B) doped oxide film.

A silicon dioxide film 15, of 2000 A. thick and containing germanium, arsenic and boron (hereinafter termed as a (Ge+As+B) doped oxide film) was coated on the surface of the wafer 3 by the high frequency sputtering technique.

4 sheets of $GeO_2$ each having an area of 6 cm.$^2$ and acting as the germanium source, 10 sheets of $B_2O_3$ each having an area of 0.25 cm.$^2$ and acting as the source of boron and 9 sheets of metallic arsenic each weighing 10 mg. and acting as the arsenic source were respectively mounted on a quartz sheet having an area of 150 cm.$^2$.

High frequency sputtering was performed under substantially the same conditions for forming the (Ge+B) doped oxide film.

Figure 8:
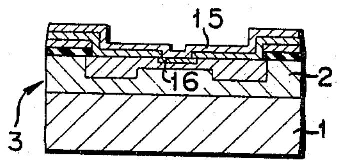

The wafer 3 was then heated in a nitrogen flow at a temperature of 1000° C. for 9 minutes to diffuse arsenic into the semiconductor body from the (Ge+As+B)

doped oxide film in the emitter opening 11 to form an emitter layer 16 (see FIG. 8). The surface concentration of the arsenic diffused emitter layer 16 was presumed to be about $1.5\times10^{20}/cm.^3$.

By the steps described above in the silicon wafer 13 was formed a transistor structure having an emitter junction depth $Xje=0.1\mu$, a base width of $0.1\mu$, a base depth around the periphery of the emitter layer of $0.2\mu$ the resistivity of the base layer immediately below the emitter layer of 16 kilohms/square, and the number of carriers of the base layer $Nc\doteqdot3\times10^{12}/cm.^2$.

Figure 9:
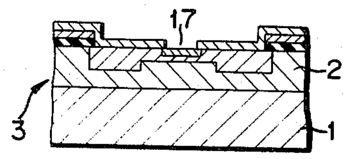

The wafer 3 was then dipped in the P-etchant for 120 minutes to dissolve off the (Ge+As+B) doped oxide film to expose the surface of the semiconductor wafer in the opening for attaching an emitter electrode 17 (same as the emitter opening 11). (See FIG. 9.)

After diffusion of the impurity, the etching rate of the (Ge+As+B) doped oxide film for the P-etchant was about 30 A./sec.

Figure 10:
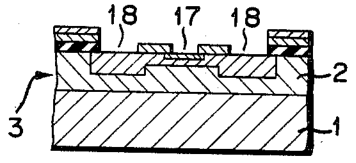

The second boron containing silicon dioxide film of the wafer was then selectively etched by the photo-etching technique to form on the P+-type guard ring 8 five openings for forming a base electrode, each $3\mu$ wide and $50\mu$ long. (See FIG. 10.)

Then a platinum film of 300 A. thick was coated on the surface of the wafer 3 by the electron beam deposition technique, and then the coated wafer was heated in a flow of hydrogen at a temperature of 700° C. for 30 minutes to form platinum silicide on the surface of the wafer 3 at portions where an emitter electrode and a base electrode are to be formed. Then the wafer 3 was boiled in aqua regia to remove surplus platinum. A titanium film, 300 A. thick, and an aluminium film, 5000 A. thick, were successively vapour deposited on the wafer 3 and then the titanium and aluminium films were removed by the photo-etching process excepting the electrode portions. Thereafter the wafer was splitted into a plurality of NPN-type silicon planer transistors for microwave use according to the conventional method.

The transistor fabricated by the method of this embodiment has narrow base width and low base resistance as above described so that its power gain and noise factor in the microwave region are extremely favourable. Thus for example, it has a power gain of 11 db at a frequency of 2 gHz. and at a collector current of 10 ma. and a noise factor of 3.5 db at a collector current of 5 ma.

On the other hand, a microwave transistor having a conventional phosphorus diffused emitter has a power gain of 10 db and a noise factor of 5 db which means that the transistor fabricated according to this invention has more desirable power gain and noise factor charteristic. Although in the above embodiment silicon substrate was used it will be clear that germanium substrate can also be used.

EXAMPLE 2

Figure 12:
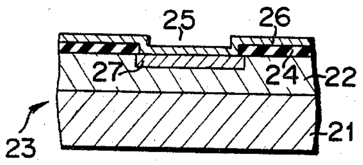
FIGS. 12 to 17 are sectional views of a semiconductor device illustrating various steps of another embodiment of this invention.

In this example, a P-type layer of a resistivity of 1 ohm-cm. and $3\mu$ thick was epitaxially grown on the surface of a P+-type silicon substrate 21 to form a silicon wafer 23 which was heated in a flow consisting of $SiH_4$, $O_2$ and $N_2$ at a temperature of 450° C. to deposit a silicon dioxide film 24 to a thickness of 5000 A. on the epitaxially grown layer 22 as shown in FIG. 12.

Then the layer was heated in a nitrogen flow at a temperature of 1100° C. for 10 minutes to increase the density of the silicon dioxide film and then a base opening 25 was formed in the silicon dioxide film 24 by the photo-etching technique at portions at which a base is to be formed.

Then the wafer 23 was heated in a mixture consisting of $SiH_4$, $PH_3$, $O_2$ and $N_2$ at a temperature of 450° C. to deposit a phosphorus containing silicon dioxide film 23, 3000 A. thick, on the surface of the wafer. The wafer was then heated in a nitrogen flow at a temperature of 1000° C. for 20 minutes to diffuse phosphorus in the epitaxially grown layer 22 immediately beneath the phosphorus containing silicon dioxide film 26 to form a base layer 27 having a surface concentration of about $1\times10^{19}/cm.^3$.

Figure 13:
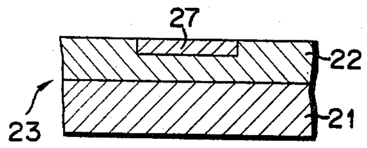

The wafer 23 was then dipped in hydrofluoric acid to completely dissolved off the silicon dioxide films 24 and 26 as shown in FIG. 13.

Figure 14:
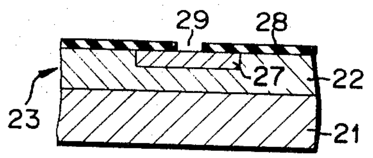

The wafer 23 was again heated in the atmosphere consisting of $SiH_4$, $O_2$ and $N_2$ at a temperature of 450° C. to deposit a silicon dioxide film 28 of a thickness of 3000 A. on the surface of the wafer. Then the wafer was heated in a nitrogen flow at a temperature of 1000° C. for 5 minutes to increase the density of the silicon dioxide film 28 and an emitter opening 29 was formed therein by the photo-etching technique as shown in FIG. 14.

A (Ge+B) doped oxide film 30 of a thickness of 3000 A. was formed on the wafer 23 by the high frequency sputtering technique under substantially the same conditions using a source of similar impurities to those used in the Example 1, excepting that $B_2O_2$ had an area about 10 times broader than in Example 1.

Figure 15:
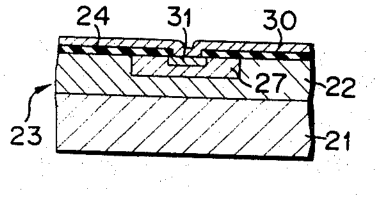

The wafer 23 was then heated in a nitrogen flow at a temperature of 1000° C. for 45 minutes to diffuse boron from the (Ge+B) doped oxide film 30 in the emitter opening 29 to form an emitter layer 31 as shown in FIG. 15. The surface concentration of emitter layer 31 was about $2\times10^{20}/cm.^3$, the emitter depth was 4000 A. and the base width was 3000 A.

Figure 16:
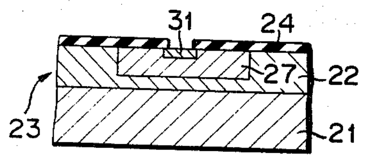

The wafer 23 was then dipped in the P-etchant for about 120 seconds to completely dissolve off the (Ge+B) doped oxide film 30 as shown in FIG. 16.

After boron diffusion, the etching rate of the (Ge+B) doped oxide film 30 for the P-etchant was 30 A./sec. which is much higher than the etching rate of 3 A./sec. of the conventional high purity silicon dioxide film, which means ready etching of the (Ge+B) doped oxide film.

Figure 17:
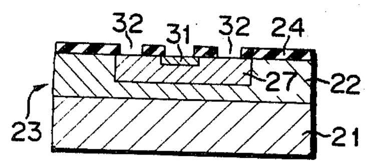

Then a base electrode opening 32 is formed in the silicon dioxide film 24 as shown in FIG. 17. After applying electrodes by a conventional method the wafer was split into a plurality of silicon PNP-type planer transistors for high frequency use.

As above described this invention makes possible to readily fabricate PNP-type transistors by the washed emitter method.

EXAMPLE 3

Figure 18:
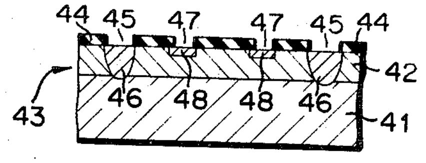
FIGS. 18 to 21 are similar views to illustrate various steps of still another embodiment of this invention.

An N-type layer 42 of $1\mu$ thick and containing antimony at a concentration of $1\times10^{16}/cm.^3$ was epitaxially grown on the surface of a P-type silicon substrate 41 containing boron at a concentration of $1\times10^{14}/cm.^3$ to prepare a silicon wafer 43, which was then heated in an atmosphere consisting of $SiH_4$, $O_2$ and $N_2$ at a temperature of 450° C. to deposit a silicon dioxide film 44 having a thickness of 5000 A. on the surface of the epitaxially grown layer 43, as shown in FIG. 18.

An opening 45 was formed in the silicon dioxide film 44 by the photo-etching technique and then an acceptor impurity was diffused through this opening 45 to form a P+-type diffused separation layer 46.

An opening 47 was then formed through the silicon dioxide film 44 to diffuse a donor impurity therethrough to form an N+-type selectively diffused layer 48 for the source and drain electrodes.

Figure 19:
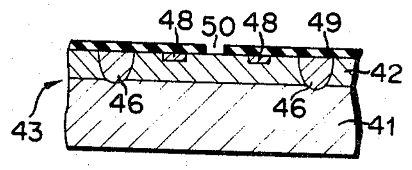

Then the wafer 43 was treated with hydrofluoric acid to completely remove the silicon dioxide film 44 and then a silicon dioxide film 49 having a thickness of 3000 A. was again deposited on the surface of the wafer 43 in the same manner as above described. An opening 50 for diffusing the gate region and having a width of $1.5\mu$ was formed in the film 49 by the photo-etching technique, as shown in FIG. 19.

Figure 20:
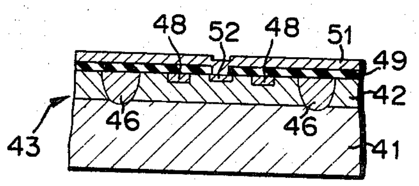

By the same high frequency sputtering technique as has been described in connection with Example 2 was used to deposit a (Ge+B) doped oxide film 51, 3000 A. thick, on the silicon dioxide film 49 and then the wafer 43 was heated in a nitrogen flow at a temperature of 900° C. for 15 minutes to form a $P^+$-type diffused layer 52 for the gate electrode, having a surface concentration of $2\times10^{20}/cm.^3$ and a diffusion depth of $0.1\mu$. (See FIG. 20.)

A platinum film of a thickness of about 300 A. was coated on the surface of the wafer 43 by the electron beam vapour deposition, and then the wafer was heated in a nitrogen flow to form a film of platinum silicide on the surface of the wafer at portions where various electrodes are to be formed. Then the wafer 43 was boiled in aqua regia to remove surplus platinum.

Figure 21:
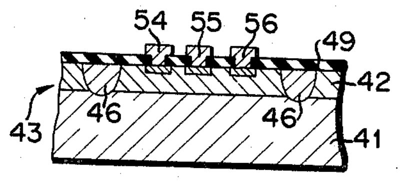

Then a source electrode 54, a drain electrode 55 and a gate electrode 56 were formed by the vapour deposition of a titanium film and a aluminium film in the same manner as in Example 1. (See FIG. 21.)

In this manner, a silicon junction type field effect transistor for microwave use was completed.

Above described process steps assure the fabrication of gate, source and drain electrodes at high accuracies, thus providing a semiconductor element of high quality. For example, the transistor manifested a maximum power gain of 18 db at 1000 mHz. with a gate electrode having a length of $1.5\mu$ and width of $500\mu$.

Examples of modified process steps are as follows: The germanium doped silicon dioxide film may be formed by chemical deposition in addition to the above described high frequency sputtering. For example, the (Ge+As+B) doped oxide film may be readily formed from an atmosphere consisting of $SiH_4$, $GeH_4$, $AsH_3$, $B_2H_6$ and $O_2$ at a reaction temperature lower than the diffusion temperature. Other gaseous or readily vapourizable compounds such as $SiCl_4$, $SiHCl_3$, $GeCl_4$, $AlSl_3$, $BBr_3$, $BCl_3$, etc., may be used as the raw material.

Diffusion for forming the $P^+$-type guard ring layer 8 and the P-type layer in Example 1 is not limited to the use of the (Ge+B) doped oxide but instead may be formed by the conventional vapour phase diffusion utilizing $BBr_3$ or $B_2O_3$ as the impurity source.

Similarly diffusion of boron through the emitter opening 11 in Example 1 may be performed by the conventional vapour phase diffusion. More particularly, since the diffusion of boron in Example 1 is performed before the diffusion of arsenic, even though the emitter opening 11 may be somewhat widened by the treatment by the etching solution which is carried out to remove the silicon dioxide film formed on the surface after diffusion of boron, as long as the surface concentration on the periphery of the boron diffused layer is not materially different from that at the centre of the opening 11 there will be no trouble. Of course it is desirable that the silicon dioxide film formed on the diffused layer should be as far as possible thin.

While in Example 1, the diffusion of boron for the base and the diffustion of arsenic for the emitter are performed as independent steps, the base and emitter layers may be formed by one step by coating the (Ge+As+B) doped oxide film on the surface of the wafer immediately after forming the emitter opening 11 and then heating the wafer at an elevated temperature.

Further, although in the above described embodiments the emitter opening was first formed in the (Ge+B) doped oxide film and then boron was diffused it is also possible to first diffuse boron and then to form the opening for diffusing arsenic.

In Example 3, the semiconductor body may be comprised of gallium arsenide. In this case, however, as the impurity, zinc is replaced for boron. Thus a (Ge+Zn) doped oxide film is used to dope the impurity.

The following table shows etching rates of examples wherein additive substances other than the elements utilized in the above described examples were incorporated in $SiO_2$ films and the films were etched in a 10:10:1 etching mixture of HCl, $H_2$ and $HN_4F$. The etching rates of these examples are considerably higher than the etching rate of 2 A./sec. of pure silicon dioxide film. The contents of the additive substances are shown by mol percent in the silicon dioxide film.

TABLE

| Additive substance | Mol percent | Etching rate (A./sec.) |
|---|---|---|
| $Sb_2O_3$ | 5 | 12 |
| BaO | 5 | 12 |
| Ge+B | Ge: 10; B: 6 | 10.5 |
| Ge+As | Ge: 10; As: 14 | 11 |
| Ge | 10 | 10 |

Although in the foregoing examples, openings were formed in the mask by the photo-etching technique it is to be understood that other method of fine working such as the electron beam exposure method and the like can also be used.

Although above description was made in terms of a single transistor it is clear that in the case of an integrated circuit a plurality of circuit elements are formed on a single substrate.

What we claim is:

1. A method of manufacturing an NPN type microwave transistor comprising the steps of:

(a) forming a first silicon dioxide layer having an opening on one surface of a silicon semiconductor substrate having a collector and a base region therein;

(b) forming a second silicon dioxide layer on said first layer and that portion of said surface defined by said opening, said second layer containing arsenic and germanium in an amount larger than one mol percent and sufficient to increase the etching rate of said second layer;

(c) heat treating the substrate coated with said first and second layers to diffuse said arsenic in said substrate and to form an emitter region through said opening;

(d) selectively etching off said second layer with an aqueous etching solution comprising (i) at least one selected from the group consisting of nitric acid, hydrochloric acid, and sulfuric acid, and (ii) at least one selected from the group consisting of hydrogen fluoride, sodium fluoride and ammonium fluoride to expose that surface portion of the substrate defined by the emitter opening; and (e) depositing a metal on that surface portion of the substrate defined by the opening to lead an emitter electrode from the diffused emitter region.

2. A method of manufacturing an NPN type microwave transistor comprising the steps of:

(a) forming a first silicon dioxide layer having an opening on one surface of a silicon semiconductor substrate having a collector region and a collector guard ring region therein:

(b) forming a second silicon dioxide layer on said first layer and that portion of said surface defined by said opening, said second layer containing boron and germanium in an amount greater than one mol percent and sufficient to increase the etching rate of said second layer;

(c) heat treating the substrate coated with the first and second layers to diffuse said boron into said substrate and to form a base region through said opening;

(d) selectively etching off said second layer with an aqueous etching solution comprising (i) at least one selected from the group consisting of nitric acid, hydrochloric acid, and sulfuric acid, and (ii) at least one selected from the group consisting of hydrogen fluoride, sodium fluoride and ammonium fluoride to expose that surface portion of the substrate defined by said opening;

(e) forming a third silicon dioxide layer on said first layer and the surface portion, said third layer containing boron, arsenic and germanium in an amount greater than one mol percent;

(f) heat treating the substrate coated with the first and third layers to diffuse said boron and said arsenic into said substrate and to form, through the opening, a base region from said boron and an emitter region from said arsenic;

(g) selectively etching off said third layer with an aqueous etching solution comprising (i) at least one selected from the group consisting of nitric acid, hydrochloric acid, and sulfuric acid, and (ii) at least one selected from the group consisting of hydrogen fluoride, sodium fluoride and ammonium fluoride to expose that surface portion of the substrate defined by said opening; and (h) depositing a metal on that surface portion of the substrate defined by the opening to lead an emitter electrode from the diffused emitter region.

3. A method of manufacturing a PNP high-frequency transistor comprising the steps of;

(a) forming a first silicon dioxide layer having an opening on one surface of a silicon semiconductor substrate having a collector and a base region therein;

(b) forming a second silicon dioxide layer on said first layer and that portion of said surface defined by said opening, said second layer containing boron and germanium in an amount greater than one mole percent and sufficient to increase the etching rate of said second layer;

(c) heat treating the substrate coated with said first and second layers to diffuse said boron in said substrate and to form an emitter region through the opening;

(d) selectively etching off the second layer with an aqueous etching solution comprising (i) at least one selected from the group consisting of nitric acid, hydrochloric acid, and sulfuric acid, and (ii) at least one selected from the group consisting of hydrogen fluoride, sodium fluoride and ammonium fluoride to expose that surface portion of the substrate defined by said emitter opening; and (e) depositing a metal on that surface portion of the substrate defined by the opening to lead an emitter electrode from the diffused emitter region.

4. A method of manufacturing a junction-type field effect transistor for microwave use comprising the steps of:

(a) forming a first silicon dioxide layer having an opening on one surface of an N type silicon substrate having a source and a drain region therein;

(b) forming a second silicon dioxide layer on said first layer and that portion of said surface defined by said opening, said second layer containing boron and germanium in an amount greater than one mol percent and sufficient to increase the etching rate of said second layer without effectively changing the conductivity of the substrate;

(c) heat treating the substrate coated with said first and second layers to diffuse said boron in said substrate and to form a gate diffused region through the opening;

(d) selectively etching off said second layer with an aqueous etching solution comprising (i) at least one selected from the group consisting of nitric acid, hydrochloric acid, and sulfuric acid, and (ii) at least one selected from the group consisting of hydrogen fluoride, sodium fluoride and ammonium fluoride to expose that surface portion of the substrate defined by the opening and to form a gate opening; and (e) depositing a metal on that surface portion of the substrate defined by the gate opening to lead an electrode from the gate diffused region.

5. The method of claim 1 wherein said aqueous etching solution contains nitric acid and hydrogen fluoride.

6. The method of claim 1 wherein said aqueous etching solution consists of nitric acid, hydrogen fluoride and water in a ratio of 10:15:300.

7. The method of claim 2 wherein said aqueous etching solution contains nitric acid and hydrogen fluoride.

8. The method of claim 3 wherein said aqueous etching solution contains nitric acid and hydrogen fluoride.

9. The method of claim 4 wherein said aqueous etching solution contains nitric acid and hydrogen fluoride.

10. The method of claim 1 wherein said aqueous etching solution contains hydrogen chloride and ammonium fluoride.

11. The method of claim 2 wherein said aqueous etching solution contains hydrogen chloride and ammonium fluoride.

12. The method of claim 3 wherein said aqueous etching solution contains hydrogen chloride and ammonium fluoride.

13. The method of claim 4 wherein said aqueous etching solution contains hydrogen chloride and ammonium fluoride.

References Cited

UNITED STATES PATENTS

| | | | |
|---|---|---|---|
| 2,372,535 | 3/1945 | Walker | 156—17 UX |
| 3,374,141 | 3/1968 | Junge et al. | 156—17 UX |
| 3,489,622 | 1/1970 | Barson et al. | 148—187 |
| 3,492,174 | 1/1970 | Nakamura et al. | 148—175 |
| 3,560,280 | 2/1971 | Nishida | 156—17 |
| 3,300,337 | 1/1967 | Perri et al. | 148—187 X |
| 3,309,245 | 3/1967 | Haenichen | 148—187 |
| 3,341,381 | 9/1967 | Bergman et al. | 148—187 |
| 3,342,650 | 9/1967 | Seki et al. | 148—187 |
| 3,354,008 | 11/1967 | Brixey et al. | 148—187 |
| 3,388,000 | 6/1968 | Waters et al. | 117—212 |
| 3,481,781 | 12/1969 | Kern | 117—201 X |
| 3,490,964 | 1/1970 | Wheeler | 148—187 |
| 3,497,407 | 2/1970 | Esch et al. | 156—17 |
| 3,507,716 | 4/1970 | Nishida et al. | 148—187 |

OTHER REFERENCES

Carlsen, G. S.: "Multiple Diffusion . . . From Single Diffusion," IBM Tech. Discl. Bull., vol. 9, No. 10, March 1967, pp. 1456–1458.

Pliskin et al.: "Evidence for Oxidation Growth . . . Etch Studies," J. Electrochem. Soc. vol. III, No. 7, July 1964, pp. 872–873.

L. DEWAYNE RUTLEDGE, Primary Examiner

W. G. SABA, Assistant Examiner

U.S. Cl. X.R.

29—578; 117—201, 212; 148—187, 190; 156—17; 317—235 R